United States Patent [19]

Fossey

[11] Patent Number: 5,103,451
[45] Date of Patent: Apr. 7, 1992

[54] PARALLEL CYCLIC REDUNDANCY CHECK CIRCUIT

[75] Inventor: Craig R. Fossey, Scottsdale, Ariz.

[73] Assignee: Motorola, Inc., Schaumburg, Ill.

[21] Appl. No.: 471,318

[22] Filed: Jan. 29, 1990

[51] Int. Cl.$^5$ ............................................. G06F 11/10
[52] U.S. Cl. .................................. 371/37.6; 371/37.1
[58] Field of Search ........................... 371/37.6, 37.1

[56] References Cited

U.S. PATENT DOCUMENTS

| | | | |
|---|---|---|---|
| 4,052,698 | 10/1977 | Ragle | 371/37.6 |
| 4,105,999 | 8/1978 | Nakamura | 371/37.6 |
| 4,312,068 | 1/1982 | Goss et al. | 371/37.6 |
| 4,454,600 | 6/1984 | LeGresley | 371/37.6 |
| 4,498,174 | 2/1985 | LeGresley | 371/37.6 |
| 4,593,393 | 6/1986 | Mead et al. | 371/37.6 |
| 4,700,350 | 10/1987 | Douglas et al. | 371/37.1 |
| 4,720,830 | 1/1988 | Joshi et al. | 371/37.1 |
| 4,937,828 | 6/1990 | Shih et al. | 371/37.1 |

OTHER PUBLICATIONS

Mohammed Wasfi, "Implementing Parallel Cyclic Redundancy Check (CRC) for Reliable High-Speed Point-to-Point Communication Using TAXI", Advanced Micro Devices, Inc., 1989, Publication 12572, Rev. A, Amendment /O, Issue Date Aug. 1989, pp. 1-8.

Terry Ritter, "The Great CRC Mystery", Dr. Dobb's Journal, Feb. 1986, pp. 26-34.

"Cyclic Redundancy Check Character Generator", Motorola, Inc., Publication, 1973.

*Primary Examiner*—Jerry Smith
*Assistant Examiner*—Ly V. Hua
*Attorney, Agent, or Firm*—Frank J. Bogacz

[57] ABSTRACT

A method and circuitry for generating N-bit parallel CRC code from an N-bit parallel data input source. A generating polynomial function is used to express an array of exclusive-OR gates to which the N-bit parallel data inputs are applied. A plurality of N latches is provided and connected to the exclusive-OR gate array in a feedback fashion to provide the plurality of N-bit parallel CRC codes according to the polynomial function.

10 Claims, 2 Drawing Sheets

is a block diagram of an interface for a parallel CRC circuit.

PARALLEL CYCLIC REDUNDANCY CHECK CIRCUIT

BACKGROUND OF THE INVENTION

The present invention pertains to cyclic redundancy check (CRC) circuitry and more particularly to circuitry for the generation of CRC information over a number of parallel bits of data.

Modern day technology permits the transfer of large amounts of data between computer or communication systems. During transmission these bits may become altered, thereby creating an error. In order for one computer system to detect when data sent by another computer system has an error, certain status information is often transmitted along with the data. This status information may include parity (even or odd), longitudinal redundancy check character, or cyclic redundancy check character. These are the most commonly used forms for checking the integrity of transmitted data.

For CRC generation, data bits are typically serially input into a CRC generation circuit in order to produce the appropriate CRC character or code for transmission along with the data. The serial processing for the generation of the CRC character is relatively slow when compared with the parallel processing performed by most computers. This parallel processing takes the form of 8-bit, 16-bit, etc. bits of parallel information. It is therefore desirable to speed up the CRC generation process.

One such attempt at more rapid generation of a CRC character is shown in U.S. Pat. No. 4,593,393, issued on June 3, 1986, to B. Mead et al. entitled "Quasi Parallel Cyclic Redundancy Checker" and assigned to the same assignee as the present invention. This patent teaches performing some of the tasks in parallel. However, the CRC information is still generated 1 bit at a time.

U.S. Pat. No. 4,454,600, issued on June 12, 1984, to B. Legresley and U.S. Pat. No. 4,498,174, issued on Feb. 5, 1985, to B. Legresley show quasi parallel CRC character generation. These U.S. Patents present complicated solutions to the CRC generation problem. Further, they are not truly parallel circuits since input selectors 21, 22, 23 and 24 select either one of the input bits for CRC calculation purposes. Therefore, these circuits are somewhat parallel, but extremely costly and complex in design having random access memories comparators and multiple-bit storage devices, along with address generation and selection generation circuitry.

Accordingly, it is an object of the present invention to provide a parallel CRC generation circuit with a minimum of hardware for reducing the number of clock cycles for CRC generation.

SUMMARY OF THE INVENTION

In accomplishing the object of the present invention, a novel, parallel cyclic redundancy character circuit is shown.

A parallel CRC generator circuit provides N-bit parallel CRC code output from an N-bit parallel data input of a digital source. The parallel CRC generator circuit includes a gating array which is connected to a digital source. The gating array operates in response to the N-bit parallel data input to produce a plurality of binary outputs according to a predefined generating polynomial function. The CRC generator circuit also includes a latching array which is connected to the gating array. The latching operates to store certain ones of the plurality of binary outputs which represent the N-bit parallel CRC code.

DESCRIPTION OF THE PREFERRED EMBODIMENT

CRC characters or codes are commonly used to insure the validity of data transmitted between digital systems. These CRC codes condense lengthy amounts of data into a relatively small code which can be compared to a reference code to detect errors in data transmission or storage.

CRC codes are generated with linear feedback shift register circuits. A linear feedback shift register takes input data and shifts through a series of flip-flops on successive clock cycles. Combinations of the shift register output and data input are fed back to the flip-flops via exclusive-OR gates. The state of the flip-flops upon completion of the shifting process is the CRC code.

A feedback shift register can be defined in terms of a generator polynomial P(x), which relates the input data and the CRC code via a polynomial expression. A general form of the generator polynomial is expressed below:

$$P(x) = P_n X^n + P_{n-1} X^{n-1} + \ldots + P_1 X + P_0$$

where n is the number of bits and "+" is an exclusive-OR operation.

Figure 1:
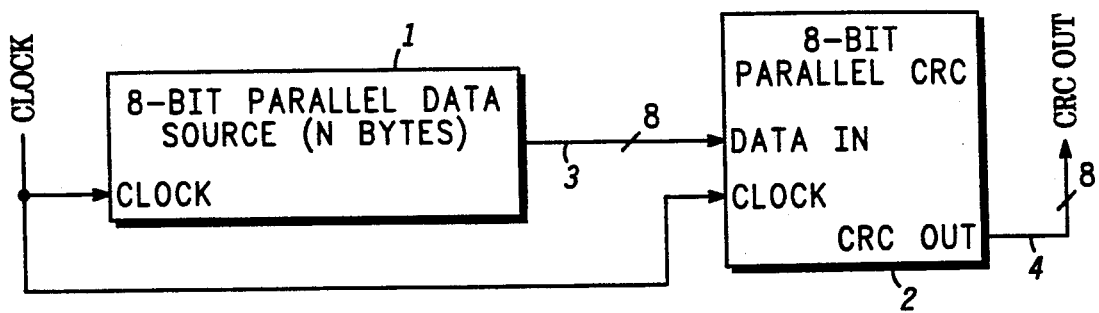
FIG. 1 is a block diagram of an interface for a parallel CRC circuit.

For a particular serial CRC code generator/checker, serial-to-parallel logic transformation techniques may be applied to produce a parallel CRC generator/checker. FIG. 1 is a block diagram of a parallel CRC generator/checker circuit. FIG. 1 shows 8-bit parallel data source 1 being connected via 8-bit bus 3 to the 8-bit parallel CRC circuit 2. The CRC output code is generated on 8-bit parallel bus 4. For each clock pulse supplied to the clock lead, 8 bits of parallel data are transferred from source 1 to CRC circuit 2 via 8-bit bus 3. Parallel CRC circuit 2 calculates the CRC code and upon the next clock pulse, that CRC is output on bus 4 while simultaneously the next 8 bits for CRC calculation are transferred from source 1 to CRC circuit 2.

Figure 2:
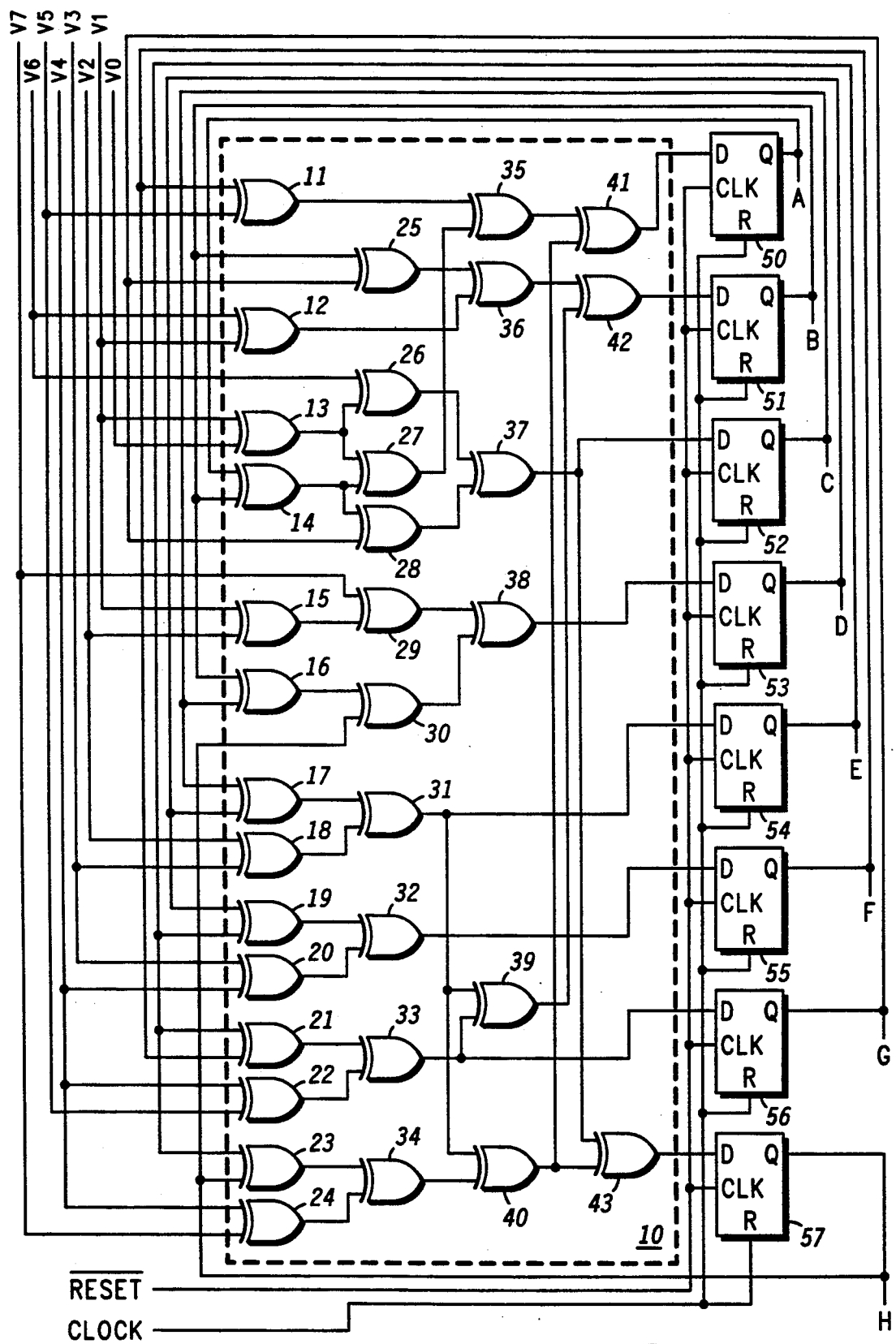
FIG. 2 is a schematic diagram of an 8-bit parallel implementation of the CRC circuitry of FIG. 1.

By applying the serial-to-parallel logic transformations to a basic serial CRC generator circuit and by minimizing the structure of the resulting circuit via Boolean algebra, the 8-bit parallel CRC circuit of FIG. 2 is derived. This parallel CRC circuit of FIG. 2 "looks ahead" 8 bits at a time relative to a serial CRC circuit. This circuit generates during one clock cycle the same states of output flip-flops as are created in eight clock cycles of a serial CRC circuit. In order to "look ahead" 8 bits, 8 consecutive bits of input data must be made available at one time to this circuit via the V0 through V7 leads.

The data inputs V0 through V7 are connected to various exclusive-OR gates of exclusive-OR gate array 10. The outputs of exclusive-OR gate array 10 are connected to the flip-flops 50 through 57. Flip-flops 50 through 57 provide the CRC code output on leads A through H respectively.

Input bit V0 is connected to an input of exclusive-OR gate 13. Input bit V1 is connected to an input of exclusive-OR gates 12, 13 and 15. Input bit V2 is connected to an input of exclusive-OR gates 15 and 18. Input bit V3 is connected to an input of exclusive-OR gates 18 and 20. Input bit V4 is connected to an input of exclusive-OR gates 20, 22 and 24. Input bit V5 is connected to an input of exclusive-OR gates 11 and 22. Input bit V6 is connected to an input of exclusive-OR gates 12 and 26. Input bit V7 is connected to an input of exclusive-OR gates 29 and 24.

The output of exclusive-OR gate 11 is connected to an input of exclusive-OR gate 35. The output of exclusive-OR gate 12 is connected to an input of exclusive-OR gate 36. The output of exclusive-OR gate 13 is connected to inputs of exclusive-OR gates 26 and 27. The output of exclusive-OR gate 14 is connected to inputs of exclusive-OR gates 27 and 28. The output of exclusive-OR gate 15 is connected to an input of exclusive-OR gate 29. The output of exclusive-OR gate 16 is connected to an input of exclusive-OR gate 30. The output of exclusive-OR gate 17 is connected to an input of exclusive-OR gate 31. The output of exclusive-OR gate 18 is connected to an input of exclusive-OR gate 31. The outputs of exclusive-OR gates 19 and 20 are connected to inputs of exclusive-OR gate 32. The outputs of exclusive-OR gates 21 and 22 are connected to an input of exclusive-OR gates 33. The outputs of exclusive-OR gate 23 and 24 are connected to inputs of exclusive-OR gate 34.

The output of exclusive-OR gate 35 is connected to an input of exclusive-OR gate 41. The output of exclusive-OR gate 36 is connected to an input of exclusive-OR gate 42. The output of exclusive-OR gate 37 is connected to an input of flip-flop 52 and to an input of exclusive-OR gate 43. The output of exclusive-OR gate 38 is connected to an input of flip-flop 53. The output of exclusive-OR gate 39 is connected to an input of exclusive-OR gate 42. The output of exclusive-OR gate 40 is connected to inputs of exclusive-OR gates 41 and 43.

The output of exclusive-OR gate 25 is connected to an input of exclusive-OR gate 36. The output of exclusive-OR gate 26 is connected to an input of exclusive-OR gate 37. The output of exclusive-OR gate 27 is connected to an input of exclusive-OR gate 35. The output of exclusive-OR gate 28 is connected to an input of exclusive-OR gate 37. The output of exclusive-OR gates 29 and 30 are connected to inputs of exclusive-OR gate 38. The output of exclusive-OR gate 31 is connected to inputs of exclusive-OR gate 40 and flip-flop 54. The output of exclusive-OR gate 32 is connected to the input of flip-flop 55. The output of exclusive-OR gate 33 is connected to the inputs of exclusive-OR gate 39 and flip-flop 56. The output of exclusive-OR gate 34 is connected to an input of exclusive-OR gate 40.

The output of exclusive-OR gate 41 is connected to the input of flip-flop 50. The output of exclusive-OR gate 42 is connected to the input of flip-flop 51. The output of exclusive-OR gate 43 is connected to the input of flip-flop 57.

Flip-flops 50 through 57 have their clock inputs connected to the clock lead. Also, flip-flops 50 through 57 have their reset inputs connected to the reset lead.

The output of flip-flop 50 is connected to an input of exclusive-OR gate 14. The output of flip-flop 51 is connected to inputs of exclusive-OR gates 14, 16 and 25.

The output of flip-flop 52 is connected to the input of exclusive-OR gates 16 and 17. The output of flip-flop 53 is connected to the inputs of exclusive-OR gates 17 and 19. The output of flip-flop 54 is connected to the inputs of exclusive-OR gates 19, 21 and 23. The output of flip-flop 55 is connected to the inputs of exclusive-OR gates 11 and 21. The output of flip-flop 56 is connected to the inputs of exclusive-OR gates 25 and 28. The output of flip-flop 57 is connected to inputs of exclusive-OR gates 23 and 30.

Table 1 depicts the progression of states for each flip-flop 50 through 57 corresponding respectively to outputs A through H. From their initial states during clock cycle 0 to the final state after eight clock cycles. Since in this example an 8-bit parallel CRC circuit is being shown, the values of flip-flops 50 through 57 with corresponding outputs A through H during clock cycle eight are the final CRC outputs.

TABLE 1

| FLIP-FLOP STATES FOR EIGHT CLOCK CYCLES | | | | | | | | | |
|---|---|---|---|---|---|---|---|---|---|
| CLOCK CYCLE | SERIAL INPUT Vin | SHIFT REGISTER FLIP-FLOPS | | | | | | | |
| | | A | B | C | D | E | F | G | H |
| 0 | V0 | A0 | B0 | C0 | D0 | E0 | F0 | G0 | H0 |
| 1 | V1 | J0 | A0 | K0 | C0 | D0 | E0 | F0 | L0 |
| 2 | V2 | J1 | A1 | K1 | K0 | C0 | D0 | E0 | L1 |
| 3 | V3 | J2 | A2 | K2 | K1 | K0 | C0 | D0 | L2 |
| 4 | V4 | J3 | A3 | K3 | K2 | K1 | K0 | C0 | L3 |
| 5 | V5 | J4 | A4 | K4 | K3 | K2 | K1 | K0 | L4 |
| 6 | V6 | J5 | A5 | K5 | K4 | K3 | K2 | K1 | L5 |
| 7 | V7 | J6 | A6 | K6 | K5 | K4 | K3 | K2 | L6 |
| 8 | V8 | J7 | A7 | K7 | K6 | K5 | K4 | K3 | L7 |

NOTE:
$J_i = H_i + V_i$
$K_i = B_i + J_i$
$L_i = G_i + J_i$

Since an 8-bit parallel CRC circuit was specified, the outputs of shift registers A through H after eight clock cycles are the values of the CRC code for 8-bit parallel circuitry shown in FIG. 2. The clock cycle number is shown in the first column. The next column indicates the particular data bit of interest. The shift register flip-flops are labeled A through H across the top of the table. For the 8-bit parallel example, the value of the shift register flip-flops A through H of interest is the value for clock cycle eight. For example, the value of shift register A for the final CRC code is J7. It can be seen that J7 is equal to H7 exclusive-ORed with V7. Expanding H7 from the table it is equal to L6. L6 is equal to G6 exclusive-ORed with J6. By continually expanding out each term, it will be seen that A8 is equal to A0+B0+C0+D0+E0+F0+H0+V0+V2+V3+V4+V5+V6+V7.
Where "+" is an exclusive-OR operation.

$A1 = J0 = H0 + V0$
$A2 = J1 = G0 + H0 + V0 + V1$
$A3 = J2 = F0 + G0 + H0 + V0 + V1 + V2$
$A4 = J3 = E0 + F0 + F0 + G0 + H0 + V0 + V1 + V2 + V3$
$A5 = J4 = D0 + E0 + F0 + G0 + H0 + V0 + V1 + V2 + V3 + V4$
$A6 = J5 = C0 + D0 + E0 + F0 + G0 + H0 + V0 + V1 + V2 + V3 + V4 + V5$
$A7 = J6 = K0 + C0 + D0 + E0 + F0 + G0 + H0 + V0 + V1 + V2 + V3 + V4 + V5 + V6$
$= B0 + C0 + D0 + E0 + F0 + G0 + V1 + V2 + V3 + V4 + V5 + V6$

-continued $$A8 = J7 = K1 + B0 + C0 + D0 + E0 + F0 + G0 + V1 + V2 + V3 + V4 + V5 + V6 + V7$$
$$= A0 + B0 + C0 + D0 + E0 + F0 + H0 + V0 + V2 + V3 + V4 + V5 + V6 + V7$$

Similarly for CRC code bits B8 through H8 they are given expanded in the following equations:

$$B8 = A7 = B0 + C0 + D0 + E0 + F0 + G0 + V1 + V2 + V3 + V4 + V5 + V6$$
$$C8 = K7 = A6 + J7 + J5 + J7 = A0 + B0 + G0 + V1 + V6 + V7$$
$$D8 = K6 = A5 + J6 = J4 + J6 = B0 + C0 + H0 + V0 + V5 + V6$$
$$E8 = K5 = A4 + J5 = J3 + J5 = C0 + D0 + V4 + V5$$
$$G8 = K3 = A2 + J3 = J1 + J3 = E0 + F0 + V2 + V3$$
$$H8 = L7 - K2 + J7 = A1 + J2 + J7 = J0 + J2 + J7 =$$
$$F0 + G0 + V1 + V2 + J7$$
$$= A0 + B0 + C0 + D0 + E0 + G0 + H0 + V0 + V1 + V3 + V4 + V5 + V6 + V7$$

As can be seen from the above, each bit is defined in terms of exclusive-OR's of input bits along with intermediate states generated by the CRC circuit.

Thus, as can be seen, the CRC code generation formerly took eight clock cycles in the serial CRC implementation now takes one clock cycle during this 8-bit parallel implementation. The circuit looks ahead 8 bits at a time compared to the serial implementation. Thus, it can seen that the circuit is approximately 8 times faster than a similar serial circuit. Further, since many systems store data in bytes or multiples of bytes rather than serially, the CRC generator is naturally adaptable to byte or multiple byte system orientations. CRC's may be generated on 8-bits, 16-bits, 24-bits, 32-bits, etc. This parallel CRC generation results in a much higher bit transfer rate for digital hardware than could be previously achieved with a serial CRC generating circuit.

Figure 3:
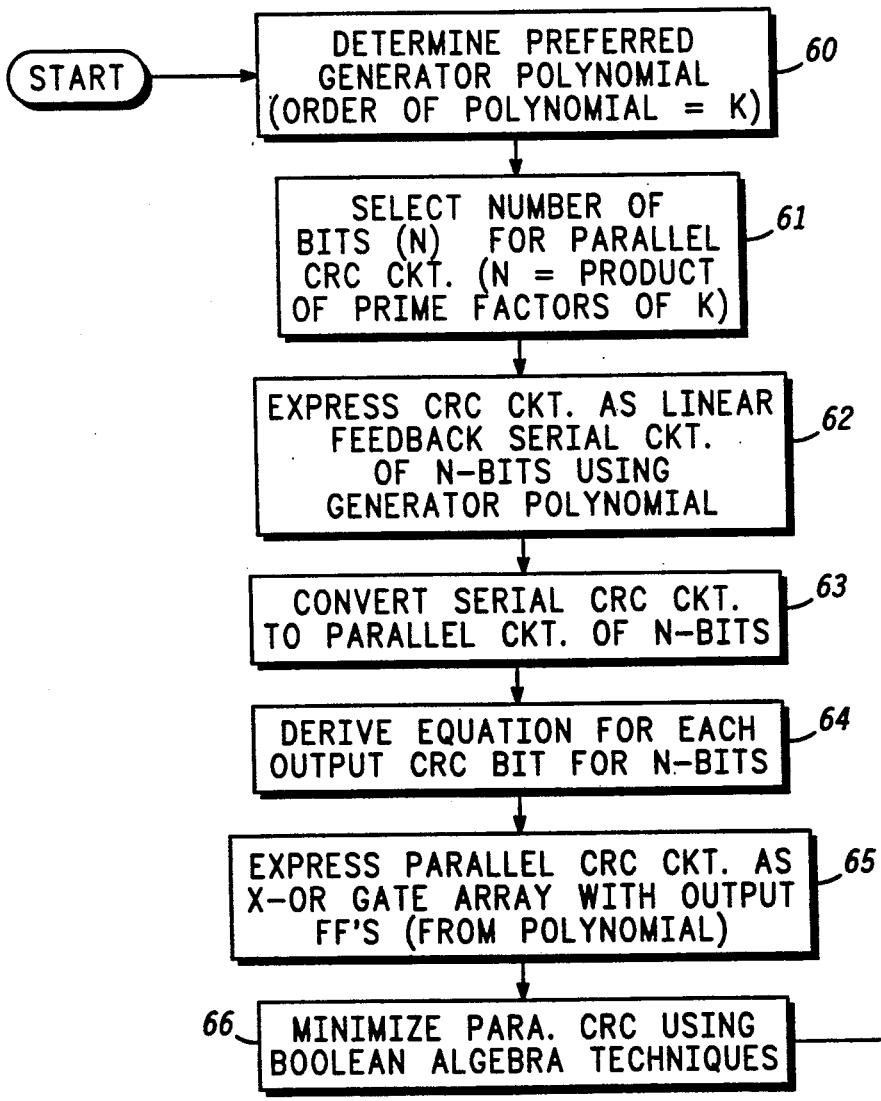
FIG. 3 is a flow chart of the method for generating parallel CRC circuitry.

Referring to FIG. 3, a generalized method for creating a parallel CRC generator circuit is shown. This method is initiated with the start block and as a result, block 61 is entered. Block 60 determines the preferred generator polynomial. The maximum exponent of the generator polynomial is the number of flip-flops (K) in a linear feedback shift register implementation of the CRC circuit. Block 61 selects the number of bits for the parallel CRC circuit. N is a product of the prime factors of K. Since most processors and memories are organized by a number of bytes (8 bits), multiples of bytes are typically selected for the parallel CRC circuit generation.

The CRC circuit of n bits is expressed as a linear feedback serial circuit of n bits according to the following generator polynomial.

$$P(X) = P_n X^n + P_{n-1} X^{n-1} + \ldots + P_1 X + P_0$$

Where "+" represents an exclusive-OR operation and n the number of bits, block 62.

Then the serial CRC circuit is converted to a parallel CRC circuit of n bits, block 63. Well-known logic transformation techniques may be applied to the serial circuit in order to produce a parallel CRC circuit version. This parallel CRC circuit effectively "looks ahead" n bits.

Next, an equation is derived for each of the n-output bits of the parallel CRC, block 64. These equations are the final state of each of a series of flip-flops being defined in terms of the initial data inputs to the circuit and the initial states of the flip-flops. The parallel CRC circuit is then expressed as an exclusive-OR gate array with output flip-flops, block 65. Then, each of the previously derived equations for the final output of these flip-flops is minimized according to known Boolean algebra techniques, block 66. The process is completed.

As can be seen from the above, not only is a parallel CRC circuit produced as a result of the above method, a minimal number of exclusive-OR gates also result. This keeps the hardware required by the circuitry to a minimum. In addition, there is one output flip-flop for each CRC bit. The configuration will contain n flip-flops.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A parallel Cyclic Redundancy Check (CRC) generator/checker circuit for providing N-bit parallel CRC code output from an N-bit parallel data input of a digital source, said parallel CRC generator circuit comprising:
   a plurality of exclusive-OR gating means connected to said digital source and said gating means operating in response to said N-bit parallel data input to produce a plurality of binary outputs according to a predefined generating polynomial function;
   said plurality of exclusive-OR gating means including;
      a plurality of first exclusive-OR gating means connected to said digital source via said N-bit parallel data input;
      a plurality of second exclusive-OR gating means connected to said plurality of first exclusive-OR gating means, to said digital source and to said latching means;
      a plurality of third exclusive-OR gating means connected to said pluralities of first and second exclusive-OR gating means and to said plurality of latching means; and
      a plurality of fourth exclusive-OR gating means connected between said plurality of third exclusive-OR gating means and said plurality of latching means; and
   a plurality of latching means connected to said gating means and said latching operating to store certain ones of said plurality of binary outputs representing said N-bit parallel CRC code.

2. A parallel CRC generator/checker circuit as claimed in claim 1, wherein said plurality of latching means includes a plurality of flip-flop means.

3. A parallel CRC generator/checker circuit as claimed in claim 2, wherein said plurality of flip-flop means includes N flip-flops, each flip-flop producing 1 bit of said N-bit parallel CRC code.

4. A parallel CRC generator/checker circuit as claimed in claim 3, wherein there is further included:
   means for resetting connected to each of said N flip-flops, said means for resetting operating to place each of said N flip-flops in a predetermined initial state; and
   means for clocking connected to each of said plurality of N flip-flops, said means for clocking causing each of said flip-flops to store a corresponding bit of said N bits of parallel CRC code.

5. A parallel CRC generator/checker circuit as claimed in claim 1, wherein said plurality of parallel binary outputs are produced according to said predefined generating polynomial function $$P(X) = P_n X^n + P_{n-1} X^{n-1} + \ldots + P_1 X + P_0$$

where n=N the number of parallel bits of CRC code; and "+" is an exclusive-OR operation.

6. A method for generating N bits of parallel CRC code output from an N-bit parallel data input, said method including the steps of:

expressing a serial linear feedback CRC circuit of N bits according to a predefined generating polynomial function;

converting said expressed serial CRC circuit to a parallel circuit of length N-bits;

deriving equations for each of said N bits of parallel CRC code from said N bits of parallel data input; and expressing said parallel CRC circuit with an array of exclusive-OR gates and flip-flops according to said predefined generating polynomial function.

7. A method for generating N-bit parallel CRC code as claimed in claim 6, wherein there is further included the step of selecting a number of bits (N) for said parallel CRC circuit.

8. A method for generating N-bit parallel CRC code as claimed in claim 7, wherein there is further included the step of minimizing the parallel CRC circuit utilizing Boolean algebra techniques.

9. A method for generating N-bit parallel CRC code as claimed in claim 10, wherein there is further included the step of using for said predefined generating polynomial function $$P(X) = P_n X^n + P_{n-1} X^{n-1} + \ldots + P_1 X + P_0$$

where n=N the number of parallel bits of CRC code; and "+" is an exclusive-OR operation.

10. A method for generating N-bit parallel CRC code as claimed in claim 6, wherein there is further included the step of determining a preferred generator polynomial function wherein the order of said preferred generator polynomial function=K and N is a product of the prime factors of K.

* * * * *

UNITED STATES PATENT AND TRADEMARK OFFICE
CERTIFICATE OF CORRECTION

PATENT NO. : 5,103,451
DATED : April 7, 1992
INVENTOR(S) : Craig R. Fossey

It is certified that error appears in the above-indentified patent and that said Letters Patent is hereby corrected as shown below:

In column 8, claim 9, line 13, delete "10" and substitute --6--.

Signed and Sealed this

Eighth Day of June, 1993

Attest:

MICHAEL K. KIRK

Attesting Officer

Acting Commissioner of Patents and Trademarks